United States Patent [19]
Tuttle

[11] Patent Number: 6,080,509
[45] Date of Patent: *Jun. 27, 2000

[54] THIN-PROFILE BATTERY CIRCUITS AND CONSTRUCTIONS, BUTTON-TYPE BATTERY CIRCUITS AND CONSTRUCTIONS, METHODS OF FORMING THIN-PROFILE BATTERY CIRCUITS AND CONSTRUCTIONS, AND METHODS OF FORMING BUTTON-TYPE BATTERY CIRCUITS AND CONSTRUCTIONS

[75] Inventor: Mark E. Tuttle, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 09/255,057

[22] Filed: Feb. 22, 1999

Related U.S. Application Data

[62] Division of application No. 08/954,975, Oct. 20, 1997.

[51] Int. Cl.⁷ .............................. H01M 6/42; H01M 2/24; H01M 6/12
[52] U.S. Cl. ........................... 429/157; 429/158; 429/162
[58] Field of Search .................................... 429/157, 158, 429/162, 178

[56] References Cited

U.S. PATENT DOCUMENTS

| | | |
|---|---|---|
| 2,745,894 | 5/1956 | Nowotny . |
| 2,798,895 | 7/1957 | Nowotny . |
| 3,891,462 | 6/1975 | Langkau . |
| 4,091,186 | 5/1978 | Ott et al. ................................. 429/157 |
| 4,648,125 | 3/1987 | Brown ........................................ 455/90 |
| 5,242,763 | 9/1993 | Konishi et al. ........................... 429/27 |
| 5,497,140 | 3/1996 | Tuttle ......................................... 342/51 |
| 5,558,679 | 9/1996 | Tuttle .................................... 29/623.1 |
| 5,601,941 | 2/1997 | Tuttle ...................................... 429/121 |

OTHER PUBLICATIONS

U.S. application No. 08/705,043, O'Toole et al., filed Aug. 29, 1996.

*Primary Examiner*—Maria Nuzzolillo
*Assistant Examiner*—Tracy Dove
*Attorney, Agent, or Firm*—Wells, St. John, Roberts, Gregory & Martkin P.S.

[57] ABSTRACT

Thin-profile battery circuits and constructions, and in particular button-type battery circuits and constructions and methods of forming the same are described. In one implementation, a substrate is provided having an outer surface with a pair of spaced electrical contact pads thereon. At least two thin-profile batteries are conductively bonded together in a stack having a lowermost battery and an uppermost battery. The batteries include respective positive and negative terminals. The lowermost battery has one of its positive or negative terminals adhesively bonded to one of the pair of electrical contact pads while the uppermost battery has one of its positive or negative terminals electrically connected to the other of the pair of electrical contact pads. The batteries can be provided into parallel or series electrical connections. An electrical insulator is disposed about a portion of only one of the batteries.

1 Claim, 5 Drawing Sheets

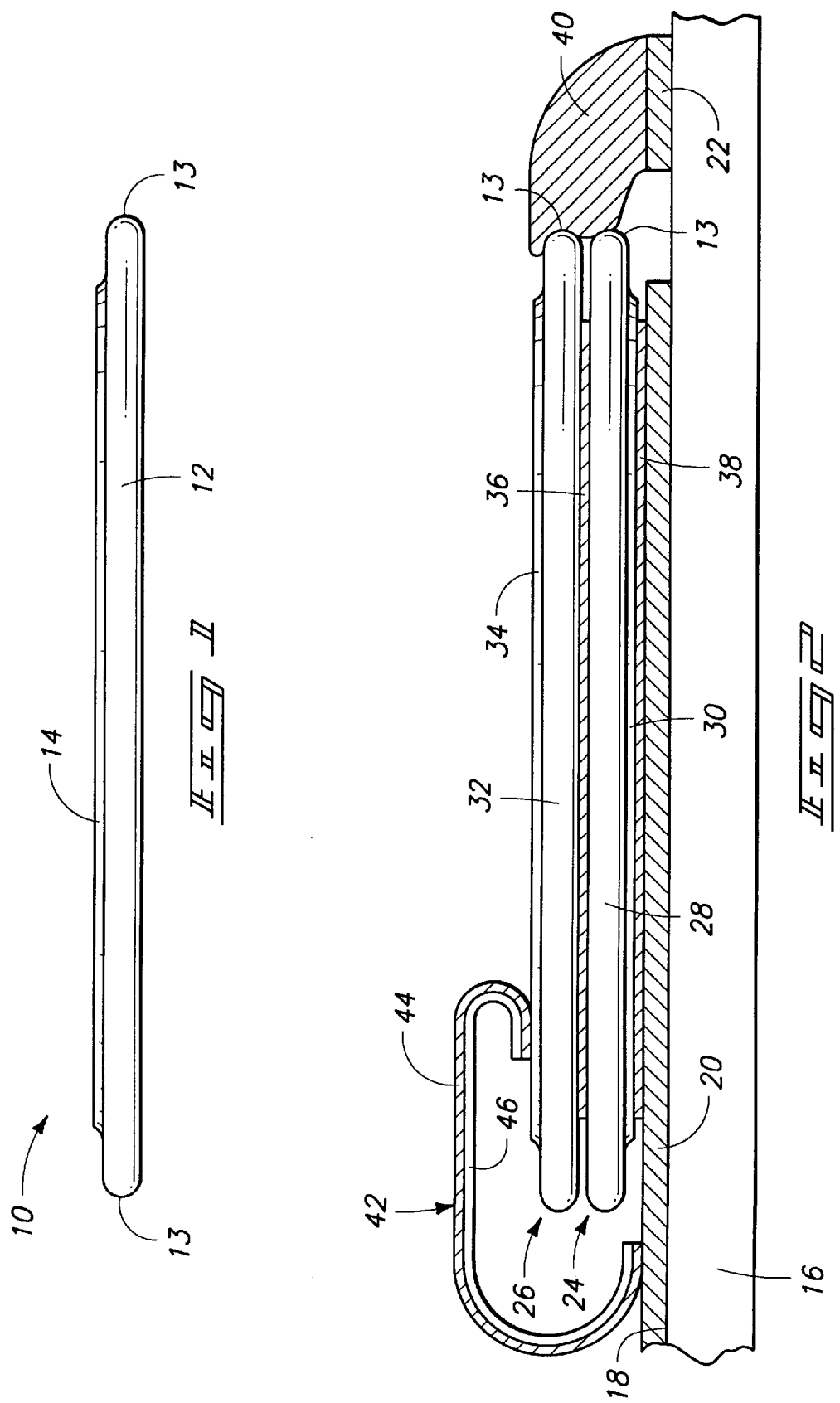

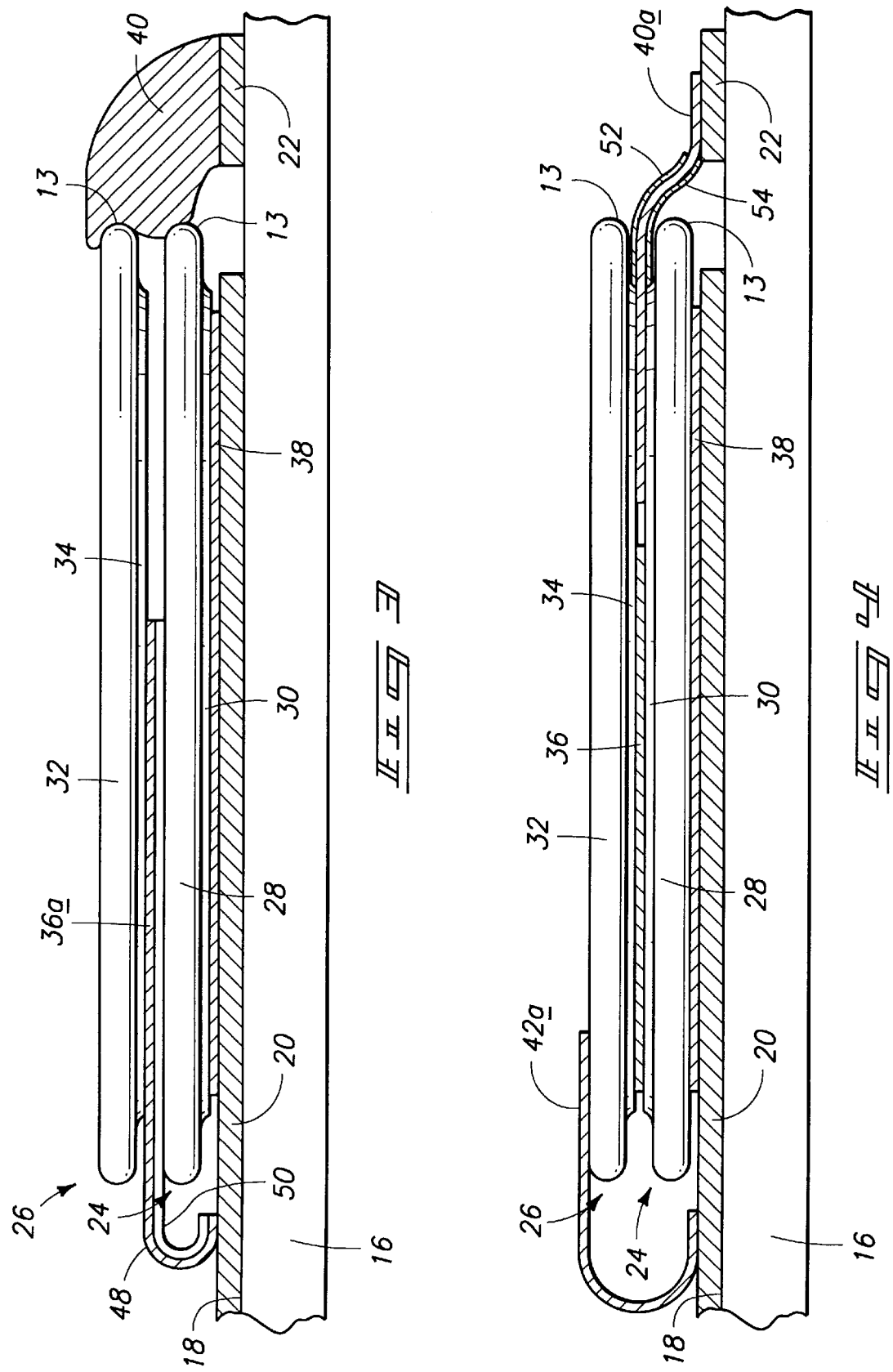

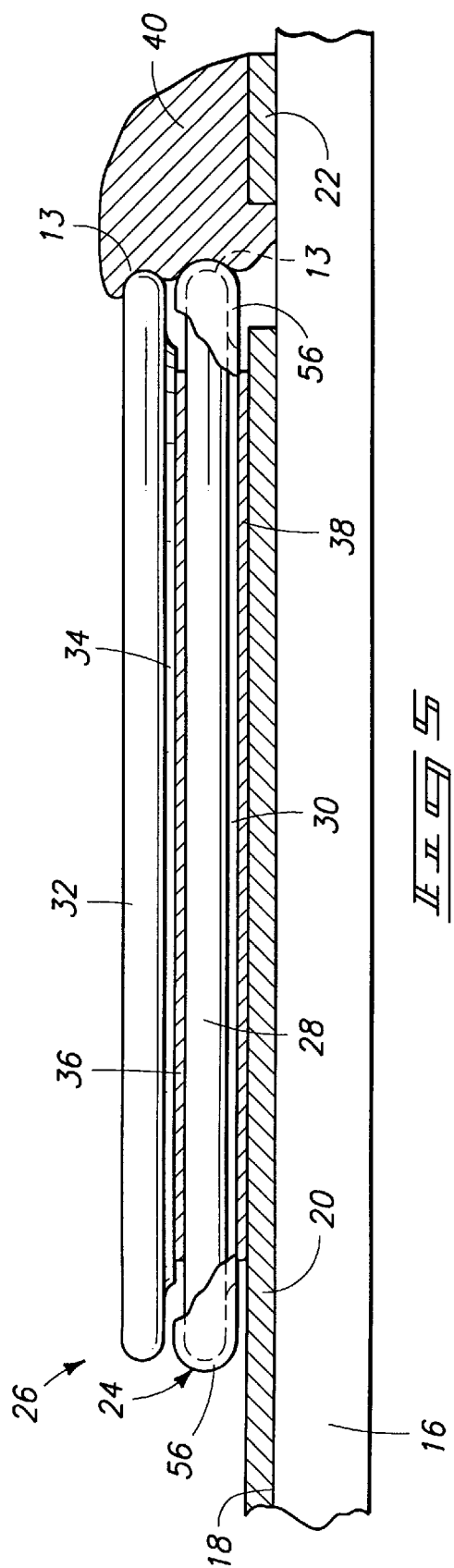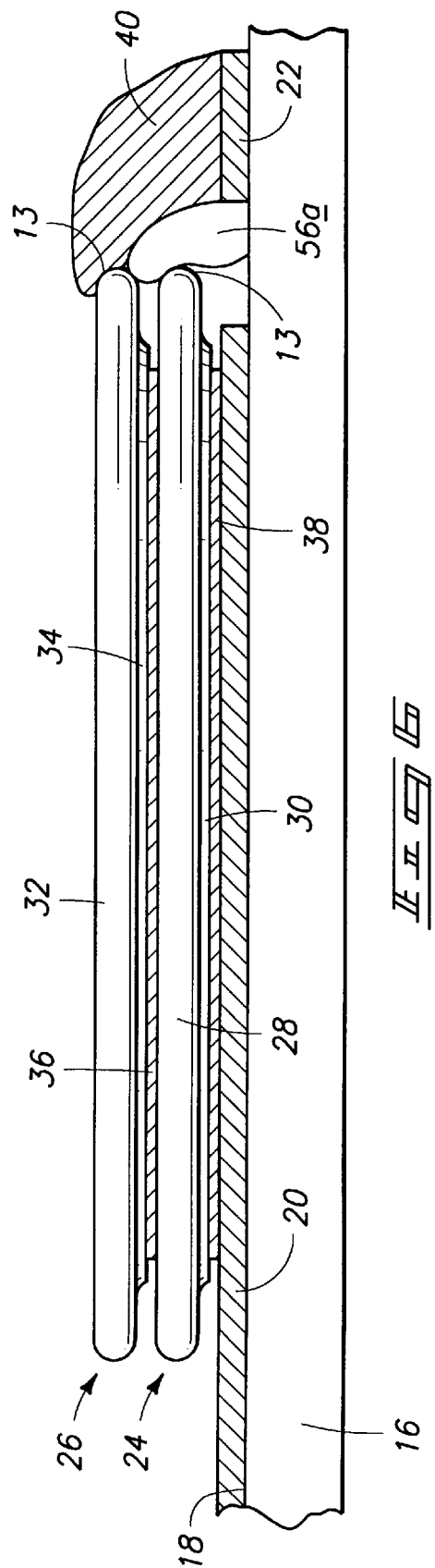

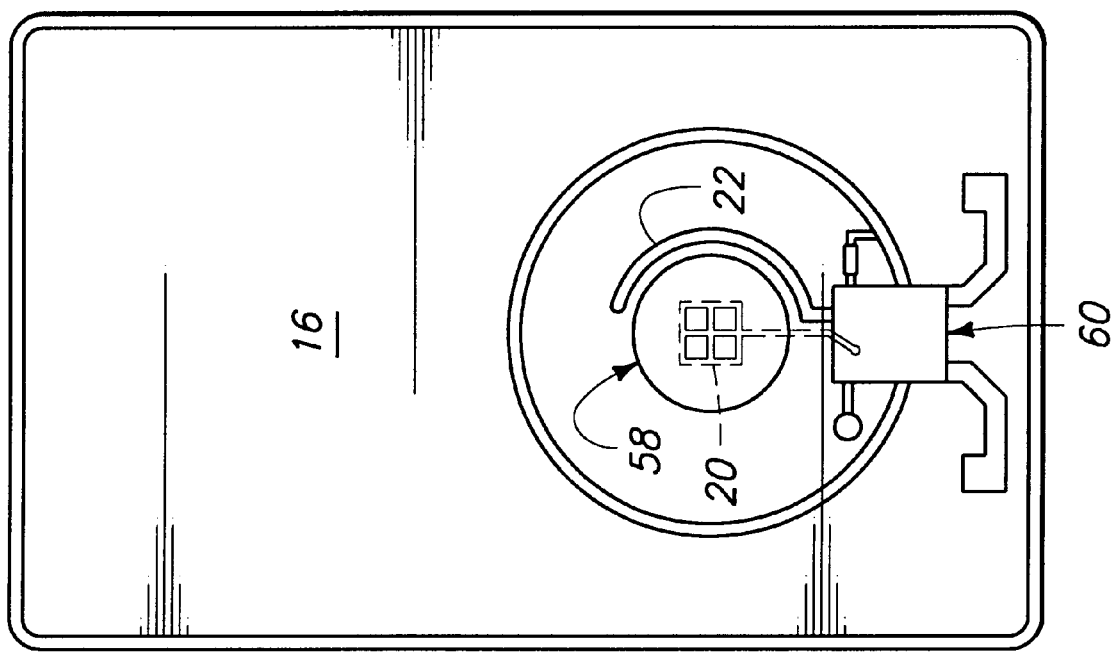

THIN-PROFILE BATTERY CIRCUITS AND CONSTRUCTIONS, BUTTON-TYPE BATTERY CIRCUITS AND CONSTRUCTIONS, METHODS OF FORMING THIN-PROFILE BATTERY CIRCUITS AND CONSTRUCTIONS, AND METHODS OF FORMING BUTTON-TYPE BATTERY CIRCUITS AND CONSTRUCTIONS

RELATED PATENT DATA

This patent resulted from a divisional application of U.S. patent application Ser. No. 08/954,975, filed Oct. 20, 1997, entitled "Thin-Profile Battery Circuits and Constructions, Button-Type Battery Circuits and Constructions, Methods of Forming Thin-Profile Battery Circuits and Constructions, and Methods of Forming Button-Type Battery Circuits and Constructions", naming Mark E. Tuttle as inventor.

TECHNICAL FIELD

This invention relates to thin-profile battery circuits and constructions, and in particular button-type battery circuits and constructions. The invention also relates to methods of forming such circuits and constructions.

BACKGROUND OF THE INVENTION

Thin-profile batteries comprise batteries that have thickness dimensions which are less than a maximum linear dimension of its anode or cathode. One type of thin-profile battery is a button-type battery. Such batteries, because of their compact size, permit electronic devices to be built which themselves are very small or compact. Yet in some electronic devices it is desirable to provide higher voltages and/or longer battery lifetimes than single thin-profile or button-type batteries permit.

This invention arose out of concerns associated with providing thin-profile battery circuits and constructions, and in particular button-type battery circuits and constructions which have enhanced power production capabilities and/or battery lifetimes. This invention also arose out of concerns associated with providing circuits and constructions which utilize more than one battery and which minimize the impact such circuits and constructions have on overall device dimensions. This invention also arose out of concerns associated with providing methods of forming such circuits and constructions.

SUMMARY OF THE INVENTION

Thin-profile battery circuits and constructions, and in particular button-type battery circuits and constructions and methods of forming the same are described. In one implementation, a substrate is provided having an outer surface with a pair of spaced electrical contact pads thereon. At least two thin-profile batteries are conductively bonded together in a stack having a lowermost battery and an uppermost battery. The batteries include respective positive and negative terminals. The lowermost battery has one of its positive or negative terminals adhesively bonded to one of the pair of electrical contact pads while the uppermost battery has one of its positive or negative terminals electrically connected to the other of the pair of electrical contact pads. The batteries can be provided into parallel or series electrical connections.

BRIEF DESCRIPTION OF THE DRAWINGS

Preferred embodiments of the invention are described below with reference to the following accompanying drawings.

FIG. 1 is a side elevational view of a thin-profile battery.

FIG. 2 is a side elevational view of a portion of a thin-profile battery circuit comprising two thin-profile batteries configured in a parallel electrical connection.

FIG. 3 is a view of a portion of a thin-profile battery circuit comprising two thin-profile batteries configured in a parallel electrical connection in accordance with another aspect of the invention.

FIG. 4 is a view of a portion of a thin-profile battery circuit comprising two thin-profile batteries configured in a parallel electrical connection in accordance with another aspect of the invention.

FIG. 5 is a view of a portion of a thin-profile battery circuit comprising two thin-profile batteries configured in a series electrical connection. Portions of the drawing have been broken away for clarity.

FIG. 6 is a view of a portion of a thin-profile battery circuit comprising two thin-profile batteries configured in a series electrical connection in accordance with another aspect of the invention.

FIG. 8 is a top plan view of an electrical device comprising a battery construction in accordance with the invention.

DETAILED DESCRIPTION OF THE PREFERRED EMBODIMENTS

Figure 7:
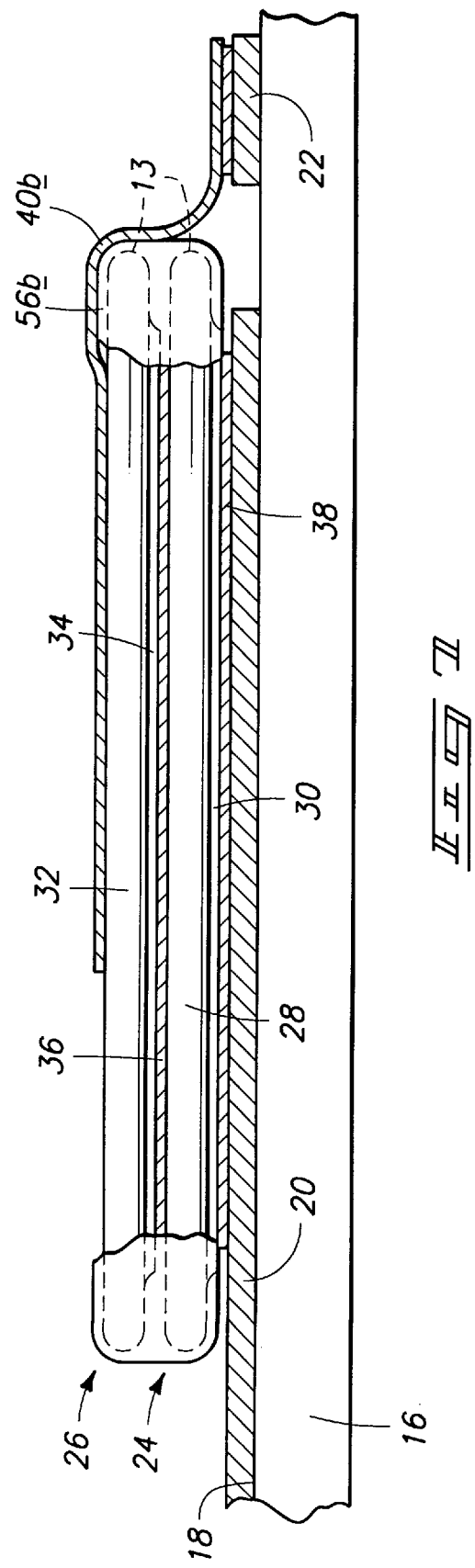
FIG. 7 is a view of a portion of a thin-profile battery circuit comprising two thin-profile batteries configured in a series electrical connection in accordance with another aspect of the invention. Portions of the drawing have been broken away for clarity.

This disclosure of the invention is submitted in furtherance of the constitutional purposes of the U.S. Patent Laws "to promote the progress of science and useful arts" (Article 1, Section 8).

Referring to FIG. 1, a single thin-profile battery is shown generally at 10 and comprises a positive terminal housing member 12. Battery 10 includes a cathode which is housed internally of housing member 12 and in electrical communication therewith. A negative terminal housing member 14 is provided and is connected with housing member 12. The battery likewise includes an anode which is housed internally of housing member 14 and in electrical communication therewith. Battery 10 includes a peripheral edge 13. In the illustrated example, thin-profile battery 10 comprises a button-type battery. Accordingly, terminal housing member 12 comprises a "can" of the battery and negative terminal housing member 14 comprises a "lid" of the battery.

In one aspect of the invention, a plurality of thin-profile batteries can be provided into various battery constructions which are configurable into either series or parallel electrical connections. The various battery constructions and circuits described just below will be understood to comprise thin-profile batteries such as the above-described battery 10.

Referring to FIGS. 2–7, various battery circuits and constructions in accordance with different aspects of the invention are shown. In the description which follows, like elements have been similarly designated with differences being indicated with suffixes "a", "b", and the like. A substrate 16 is provided and comprises an outer surface 18.

A Substrate 16 can comprise a printed circuit substrate, i.e. printed circuit board, or a flexible circuit board and the like. A pair of spaced first and second electrical contact pads 20, 22 respectively are provided over or supported by substrate 16. Exemplary materials for the contact pads include suitably screen- or stencil-printed conductive materials such as copper or conductive printed thick film (PTF). For purposes of the ongoing discussion, electrical contact pad 20 constitutes "one" pad of the pair of contact pads, while electrical contact pad 22 constitutes the "other" contact pad of the pair of contact pads.

At least two batteries 24, 26 are provided. For purposes of the ongoing discussion, battery 24 constitutes "one" or a "first" battery and battery 26 constitutes the "other" or a "second" battery. Battery 24 comprises a positive terminal housing member 28 and a negative terminal housing member 30. Similarly, battery 26 comprises a positive terminal housing member 32 and a negative terminal housing member 34.

In the illustrated examples of FIGS. 2–7, batteries 24, 26 are conductively bonded together in a stack comprising a lowermost battery, e.g. battery 24, and an uppermost battery, e.g. battery 26. Lowermost battery 24 has one of its positive or negative terminal housing members 28, 30 adhesively bonded to one of the pair of electrical contact pads 20, 22. In the illustrated examples, the subject electrical contact pad with which one of the positive or negative terminal housing members 28, 30 is bonded comprises pad 20. Uppermost battery 26 has one of its positive or negative terminal housing members 32, 34 electrically connected to the other of the pair of electrical contact pads, i.e., pad 22. Depending on the nature of the connections between the batteries and the contact pads, either a parallel electrical connection or a series electrical connection can be provided. FIGS. 2–4 illustrate various exemplary parallel connections and FIGS. 5–7 illustrate various exemplary series electrical connections.

Referring first to FIG. 2, a first electrical connection 36 is provided and conductively connects positive terminal housing members 28, 32 of respective batteries 24, 26. In the illustrated example, connection 36 comprises a conductive adhesive epoxy which adhesively bonds the batteries together in a stack. In the illustrated stack, housing members 30, 34 face generally away from one another in different directions. A second electrical connection 38 is provided between negative terminal housing member 30 of battery 24 and contact pad 20. In the illustrated example connection 38 comprises conductive adhesive epoxy which conductively bonds battery 24 on pad 20. A third electrical connection 40 is provided between positive terminal housing members 28, 32 and contact pad 22. In the illustrated example, connection 40 comprises a conductive adhesive material or epoxy which electrically connects the illustrated housing members with the contact pad. Connection 40 may or may not be formed with peripheral edges 13. Exemplary edge connection techniques and materials which are suitable for forming connection 40 are described in U.S. Pat. No. 5,601,941, the disclosure of which is incorporated by reference herein.

A conductive strap 42 is provided and comprises a conductive portion 44 which is conductively adhered to negative terminal housing member 34 and contact pad 20. An insulative portion 46 is provided and protects against conductive portion 44 coming into contact with either of positive terminal housing members 28, 32. Strap 42 places negative terminal housing members 30, 34 in electrical communication with one another by virtue of conductive portion 44 which extends therebetween. An exemplary material for conductive portion 44 is a layer comprising copper or some other suitable conductive material. An exemplary material for insulative portion 46 comprises a flexible material such as polyester or polyimide. Strap 42 comprises but one non-limiting way in which desirable electrical connection between housing members 30, 34 is achieved.

Referring to FIG. 3, batteries 24, 26 are bonded together by a first electrical connection 36a comprising a strap which is similar in construction to strap 42 (FIG. 2). Accordingly, connection 36a includes a conductive portion 48 and an insulative portion 50. Conductive portion 48 electrically connects with negative terminal housing member 34 and contact pad 20. Insulative portion 50 protects against undesirable grounding with positive terminal housing member 28 of battery 24. Second electrical connection 38 adhesively bonds negative terminal housing member 30 with contact pad 20. Third electrical connection 40 is provided and electrically interconnects the positive terminal housing members 28, 32 with contact pad 22. Electrical connection 40 can be formed as described above in connection with FIG. 2. The presently-formed stack of batteries orients housing members 28, 32 to face in a common direction.

Referring to FIG. 4, first electrical connection 36 adhesively bonds negative terminal housing members 30, 34 together. Accordingly, housing members 28, 32 face in different directions. Second electrical connection 38 adhesively bonds positive terminal housing member 28 with contact pad 20. Third electrical connection 40a is provided and electrically interconnects negative terminal housing members 30, 34 with contact pad 22. Respective insulative portions or insulators 52, 54 can be provided to protect against undesirable grounding with positive terminal housing members 28, 32. At least a portion of one of the insulators is interposed between a portion of at least one of peripheral edges 13 and contact pad 22. A conductive strap 42a is provided and electrically interconnects positive terminal housing members 28, 32 through contact pad 20.

The battery constructions and circuits described above comprise various non-limiting ways in which at least two thin-profile batteries can be connected in a stack which is configurable into a parallel electrical connection.

Referring to FIGS. 5–7, various non-limiting exemplary battery constructions and circuits which permit or achieve a series electrical connection are described.

Referring to FIG. 5, first electrical connection 36 conductively bonds positive terminal housing member 28 and negative terminal housing member 34 together in a stack. In the illustrated stack, housing members 28, 32 face in a common direction. Second electrical connection 38 conductively bonds negative terminal housing member 30 with contact pad 20. Third electrical connection 40 conductively bonds only one of the positive terminal housing members with contact pad 22. In the illustrated example, positive terminal housing member 32 is electrically interconnected with contact pad 22. An electrical insulator 56 is provided over at least a portion of peripheral edge 13 of battery 24 and interposed between the peripheral edge and contact pad 22. Such electrically insulates housing member 28 from connection material 40 and protects against undesirable grounding therebetween. Electrical insulator 56 can comprise any suitable insulator such as a shrink-wrapped tubing band or edge insulator. The illustrated insulator 56 extends around the entire periphery of the battery. A portion of insulator 56 has been broken away for clarity.

Referring to FIG. 6, first and second electrical connections 36, 38 are provided and respectively connect the batteries to one another in a stack and to contact pad 20. In the illustrated stack, housing members 28, 32 face in a common direction. Third electrical connection 40 is provided and electrically interconnects only one of the positive terminal housing members, i.e., housing member 32 with contact pad 22. An electrical insulator 56a is provided proximate only a portion of peripheral edge 13 of battery 24 and interposed between the peripheral edge and contact pad 22. Insulator 56a can be formed or dispensed over the substrate and subsequently cured or hardened after mounting the battery stack over contact pad 20.

Referring to FIG. 7, first and second electrical connection 36, 38 electrically interconnect batteries 24, 26 with one another and with contact pad 20. An electrical insulator 56b is provided over portions of both batteries and proximate each battery's peripheral edge 13. Accordingly, insulator 56b is interposed between the respective peripheral edges of the batteries and contact pad 22. The illustrated insulator extends around the entire peripheral edges of both batteries. A portion of the illustrated insulator has been broken away for clarity. Electrical connection 36 may be provided without conductive adhesive and by virtue of only the physical engagement between negative terminal housing member 34 of battery 26 and positive terminal housing member 28 of battery 24 brought on by electrical insulator 56b. Specifically, insulator 56b can comprise insulative shrink-wrap tubing which, when shrunk into place over the batteries, urges the housing members together. Third electrical connection 40b is provided by a conductive tab which is connected with and extends between positive terminal housing member 32 and contact pad 22. The conductive tab can be welded on the battery through conventional methodologies.

Referring to FIG. 8, substrate 16 is shown as comprising a portion of a radio frequency communication device. A battery construction is shown generally at 58 and can comprise any of the above-described battery constructions. A single integrated circuitry chip 60 is supported by substrate 16 and is operably connected with battery construction 58 and is powered thereby. Exemplary contact pads 20, 22 are shown at an intermediate processing point at which electrical connection 36, 38 have been formed and connection 40 has not yet been formed. In a preferred implementation, chip 60 comprises a wireless radio frequency transceiver. An exemplary single integrated circuitry chip is described in U.S. patent application Ser. No. 08/705,043, which names James is O'Toole, John R. Tuttle, Mark E. Tuttle, Tyler Lowrey, Kevin Devereaux, George Pax, Brian Higgins, Shu-Sun Yu, David Ovard and Robert Rotzoll as inventors, which was filed on Aug. 29, 1996, is assigned to the assignee of this patent application, and is fully incorporated herein by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A stack of thin-profile batteries comprising:
   a first thin profile battery comprising an anode and a cathode and battery terminal housing members electrically connected therewith, the first thin profile battery comprising a first external periphery;
   a second thin profile battery comprising an anode and a cathode and battery terminal housing members electrically connected therewith, the second thin profile battery comprising a second external periphery; and
   the first and second thin profile batteries being conductively bonded to one another in a stack; and
   an electrical insulator disposed about a portion of only one of the first and second external peripheries.

* * * * *

UNITED STATES PATENT AND TRADEMARK OFFICE
CERTIFICATE OF CORRECTION

PATENT NO.   : 6,080,509　　　　　　　　　　　　　　　　　　　　　　　　Page 1 of 1
DATED        : June 27, 2000
INVENTOR(S)  : Mark E. Tuttle It is certified that error appears in the above-identified patent and that said Letters Patent is hereby corrected as shown below:

Column 2,
Line 62, delete the "A" before the word substrate.

Column 6,
Line 5, delete the word "is" before the name O'Toole.

Signed and Sealed this

Fifth Day of March, 2002

*Attest:*

JAMES E. ROGAN
*Attesting Officer*　　　*Director of the United States Patent and Trademark Office*